(12) United States Patent
Tu

(10) Patent No.: US 10,428,424 B2
(45) Date of Patent: Oct. 1, 2019

(54) TRAY DEVICE, REACTION CHAMBER AND MOCVD APPARATUS

(71) Applicant: BEIJING NAURA MICROELECTRONICS EQUIPMENT CO., LTD., Beijing (CN)

(72) Inventor: Ye Tu, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 736 days.

(21) Appl. No.: 14/443,327

(22) PCT Filed: Nov. 12, 2013

(86) PCT No.: PCT/CN2013/086920
§ 371 (c)(1),
(2) Date: May 15, 2015

(87) PCT Pub. No.: WO2014/075601
PCT Pub. Date: May 22, 2014

(65) Prior Publication Data
US 2015/0284846 A1    Oct. 8, 2015

(30) Foreign Application Priority Data
Nov. 16, 2012 (CN) .......................... 2012 1 0464900

(51) Int. Cl.
*C23C 16/44* (2006.01)
*H01L 21/67* (2006.01)
(Continued)

(52) U.S. Cl.
CPC ........ *C23C 16/4584* (2013.01); *C23C 14/505* (2013.01); *C23C 16/18* (2013.01);
(Continued)

(58) Field of Classification Search
CPC ................ H01L 21/68771; H01L 21/68764
(Continued)

(56) References Cited

U.S. PATENT DOCUMENTS 3,424,628 A * 1/1969 Winings .............. C23C 16/4584
117/98
5,558,721 A * 9/1996 Kohmura ............ C23C 16/4588
118/500
(Continued)

FOREIGN PATENT DOCUMENTS

CN    101008080 A    8/2007
CN    102639761 A    8/2012
(Continued)

OTHER PUBLICATIONS

PCT/CN2013/086920 International Search Report dated Jan. 9, 2014; 6pgs.
(Continued)

*Primary Examiner* — Charlee J C Bennett
(74) *Attorney, Agent, or Firm* — Anova Law Group, PLLC

(57) ABSTRACT

Embodiments of the invention provide a tray device, a reaction chamber, and a MOCVD apparatus including the reaction chamber. According to an embodiment, the tray device includes a large tray, a rotating shaft, a small tray, and a supporting disk. The rotating shaft is connected with the center of the large tray and drives the large tray to rotate about the rotating shaft. The large tray is provided with a tray groove for placing the small tray. The supporting disk is located under the large tray. A sliding mechanism is provided between the supporting disk and the small tray, so that when revolving along with the large tray, the small tray spins under the function of the sliding mechanism.

20 Claims, 6 Drawing Sheets

(51) Int. Cl.
*C23C 16/458* (2006.01)
*C23C 14/50* (2006.01)
*H01L 21/687* (2006.01)
*C23C 16/18* (2006.01)

(52) U.S. Cl.
CPC .... *C23C 16/4586* (2013.01); *H01L 21/68764* (2013.01); *H01L 21/68771* (2013.01)

(58) Field of Classification Search
USPC .......................................................... 118/719
See application file for complete search history.

(56) References Cited

U.S. PATENT DOCUMENTS

| | | | | |
|---|---|---|---|---|
| 5,782,979 | A * | 7/1998 | Kaneno | C23C 16/301 118/500 |
| 6,105,534 | A * | 8/2000 | Siniaguine | C23C 16/4584 118/723 EB |
| 6,454,908 | B1 * | 9/2002 | Schertler | H01L 21/68764 118/719 |
| 2002/0083899 | A1 | 7/2002 | Komeno et al. | |
| 2004/0261596 | A1 * | 12/2004 | Kobayashi | B26D 5/16 83/691 |
| 2011/0083602 | A1 * | 4/2011 | Bergmann | C23C 16/4584 117/107 |
| 2011/0197720 | A1 * | 8/2011 | Liu | B25B 13/08 81/179 |
| 2011/0300297 | A1 * | 12/2011 | Celaru | C23C 16/4584 427/255.5 |
| 2012/0321788 | A1 * | 12/2012 | Yang | C23C 16/45502 427/255.5 |
| 2013/0298836 | A1 * | 11/2013 | Ikenaga | C23C 16/4584 118/730 |

FOREIGN PATENT DOCUMENTS

| | | | | |
|---|---|---|---|---|
| CN | 102734409 | A | * 10/2012 | |
| CN | 102734409 | A | 10/2012 | |
| CN | 102766850 | A | 11/2012 | |
| JP | 2005340403 | A | 12/2005 | |
| WO | WO-2012105313 | A1 | * 8/2012 | ......... C23C 16/4584 |

OTHER PUBLICATIONS

KR10-2015-7015913 Office Action dated Mar. 16, 2016; 7 pgs.
KR10-2015-7015913 Office Action dated Oct. 18, 2016; 3pgs.
KR10-2015-7015913 Office Action dated Feb. 23, 2017; 2 pgs.
KR10-2015-7015913 Notice of Amendment Dismissal dated Feb. 23, 2017; 2 pgs.
CN201210464900.2 Office Action dated Aug. 5, 2015; 9 pgs.
CN201210464900.2 Office Action dated Mar. 15, 2016; 6 pgs.
SG112015038520 Written Opinion dated Jan. 11, 2016; 8 pgs.

* cited by examiner

TRAY DEVICE, REACTION CHAMBER AND MOCVD APPARATUS

CROSS REFERENCE TO RELATED APPLICATION

This application claims the benefit of and priority to PCT/CN2013/086920 filed on Nov. 12, 2013, entitled (translation), "TRAY APPARATUS, REACTION CHAMBER AND MOCVD DEVICE," which claims the benefit of and priority to Chinese Patent Application No. 201210464900.2 filed on Nov. 16, 2012, entitled (translation), "REACTION CHAMBER AND MOCVD APPARATUS," both of which are hereby incorporated by reference in their entirety into this application.

BACKGROUND

Field of the Invention

Embodiments of the invention relate to the semiconductor technology, and particularly relate to a tray device, a reaction chamber, and a MOCVD apparatus.

Description of the Related Art

Vapor Phase Epitaxial (VPE) growth methods include, for example, Hydride Vapor Phase Epitaxial (HVPE) technique and Metal-organic Chemical Vapor Deposition (MOCVD) method. The Vapor Phase Epitaxial (VPE) growth technique may be used to manufacture single crystal wafers of compound semiconductor with high performance. The method mainly utilizes organic compounds of group III and group II elements and hydrides of group V and ground VI elements as a source material for crystal growth, and performs vapor phase epitaxy on the substrate in a manner of thermal decomposition reaction to grow thin layers of single crystal materials of various compound semiconductor of group III-V and ground II-VI elements and multi-component solid solutions thereof. The vapor phase epitaxial growth may be used for growth of a epitaxial thin film, especially for growth of a high quality epitaxial thin film, and has very high requirements on the temperature uniformity of a substrate material itself, concentration distribution conditions of a reaction gas, the uniformity of the reaction field above a substrate, for example, which directly decide the quality of the grown epitaxial wafer. The uniformities of heating and concentration distribution will together affect the uniformity of the distribution of the reaction field inside a reaction chamber, which in turn affects quality-related parameters such as the uniformity of an epitaxial growth.

As described above, the uniformity of heating will affect the uniformity of the epitaxial growth. Conventional heating methods include a thermal transmission method and an induction heating method. As for the thermal transmission method, generally, a substrate material is placed on a tray made of a graphite material and the tray is then placed on a base. After that, the bottom of the base is heated by using a heating part, such as a resistance wire, as a non-limiting example. The heat is transferred from the base to the tray, so that the substrate material is heated by means of heat conduction effect of the tray. In this case, if the base is heated by resistance wires within multiple regions, the temperature uniformity of the base can be improved, so that the temperature stability and the temperature uniformity can be improved during the growth of the substrate. However, in practical applications, the above thermal transmission method is slow in heating, complex in its control process, low in heat efficiency due to that the heat is not only transmitted to the surface of the substrate but also transmitted along other directions in the process of the thermal transmission, and high in design requirement for the water cooling structure of the reaction chamber.

As for the induction heating method, normally, a coil is placed under a substrate or is placed around a tray, and an induced eddy current will be generated on the surfaces of the tray and the substrate after a high-frequency current is feed into the coil, so that the substrate can be heated quickly. In practical applications, the heating is relatively faster in the induction heating method, but the tray may not be heated uniformly due to non-uniformity of the distribution of the generated magnetic field at the center of the tray and at the edges of the tray, so that heating uniformity of the substrate on the tray will be affected.

Further, the concentration distribution of a gas is also a factor affecting the uniformity of the epitaxial growth. At present, gas intake techniques mainly include a spray header technique, a central gas intake technique and a gas intake technique in which the gas is directly blown from one side to another side of a tray or chamber, and which is particularly suitable for an apparatus of small yield (i.e., 2 to 8 pieces). However, in practical applications, these techniques cannot avoid such a problem: as the temperatures in different regions inside the chamber are different (e.g., temperature difference is existed between a position close to a gas intake port and a position far away from the gas intake port, on the surface of a substrate), after a gas is introduced into the chamber, the gas is reacted easily in the region with high temperature, so that the concentrations of the reaction gas are different between the position close to the gas intake port and the position far away from the gas intake port on the surface of the substrate, thus, the uniformity of the reaction field above the substrate will be affected, which in turn causes the epitaxial wafer not to grow uniformly. The non-uniform growth of the epitaxial wafer will lead to defects on the surface of the substrate, such as occurrence of crack distribution and dislocation density, which severely affect the quality of the growth at last.

In view of above problems, those skilled in the art have proposed many improvement approaches to improve the uniformity of the epitaxial growth. For example, various corporations have proposed improvement approaches, such as a novel design of a spray header in a gas intake system, making a tray to rotate in a high speed; for another example, one corporation has proposed improvement approaches such as adopting a central stratified gas intake system, making an air cushion tray to rotate in a fashion like planetary motion (hereinafter, simply referred to as an air cushion tray planetary rotation). However, these improvement approaches have very high requirements on the precision of the mechanical structures and processes, and installation and maintenance of apparatuses produced based on these improvement approaches are relatively difficult.

Referring to FIG. 1, it illustrates a diagram of the air cushion tray planetary rotation technique generally mentioned above, wherein a plurality of small trays 102, which are used for carrying wafers 103, are provided on a large tray 101, and all of the large tray 101 and the small trays 102 are capable of rotating by means of gas suspension effect. Therefore, in a process, by means of a designed air cushion and gas circuit structure, it is possible for the small trays 102 to spin while revolving under the driving of the large tray 101.

However, the reaction chamber of the air cushion tray planetary rotation adopts resistance multi-region temperature control method, critical defects such as low in temperature raising rate, low in yield are existed in addition to complex in heating procedure. Moreover, although the air cushion planetary rotation technique can meet requirements of an epitaxial process, complex gas circuit structures must be employed to achieve the air cushion structure adopted in the planetary rotation, and complex variation of the fluid inside the chamber must be considered during the rotation. Further, the design, machining process and installation of the gas intake port of the air cushion, maintenance and usage of the apparatus are also very complex.

SUMMARY

Embodiments of the invention provide a tray device, a reaction chamber, and a MOCVD apparatus including the reaction chamber, used for solving the problems of complexity in air cushion and gas circuit structures, difficulties in design, machining process, installation, maintenance, and usage of the processing apparatus when achieving revolution and spinning of a large tray and a small tray in the conventional art.

Embodiments of the invention provide a tray device including a large tray, a rotating shaft, a small tray, and a supporting disk. According to at least one embodiment, the rotating shaft is connected with the center of the large tray and drives the large tray to rotate about the rotating shaft. A tray groove for placing the small tray therein is provided on the large tray. The supporting disk is located under the large tray and a sliding mechanism is provided between the supporting disk and the small tray, so that when revolving along with the large tray, the small tray spins by means of the sliding mechanism.

According to at least one embodiment, the sliding mechanism includes a first sliding groove and a sliding pin. The first sliding groove is formed at an upper surface of the supporting disk, an upper end of the sliding pin being fixedly connected to a first position other than the center position on the small tray, a lower end of the sliding pin being connected to the first sliding groove, and the sliding pin being configured to move along the first sliding groove. According to at least one embodiment, the first sliding groove is closed, and a distance between any point on the first sliding groove and a first track is smaller than or equal to a distance between the first position and the center of the small tray, and at least one point, distance of which from the first track is smaller than the distance between the first position and the center of the small tray, exists on the first sliding groove. According to at least one embodiment, the first track is movement track formed by the center point of the small tray when the small tray revolves.

According to at least one embodiment, the sliding mechanism includes a second sliding groove and a sliding protrusion, whereby the sliding protrusion is formed at the upper surface of the supporting disk, the second sliding groove is formed at the bottom surface of the small tray, the upper end of the sliding protrusion being slidably connected to the second sliding groove, so that when the small tray moves along with the large tray, the sliding protrusion is configured to move along the second sliding groove to drive the small tray to spin.

According to at least one embodiment, a shape (profile) of the first sliding groove is the movement track of the first position, and expressions of coordinates (X1, Y1) of the first position with respect to time t are:

$$X1 = R1 \times \cos(2 \times pi \times V1 \times t) + D1 \times \cos(2 \times pi \times V2 \times t);$$

$$Y1 = R1 \sin(2 \times pi \times V1 \times t) + D1 \times \sin(2 \times pi \times V2 \times t);$$

where the center of the large tray is set as an origin of the coordinates, R1 is a distance between the center of the small tray and the center of the large tray, D1 is the distance between the first position and the center of the small tray, V1 is a rotation speed of the large tray, and V2 is a spinning speed of the small tray. According to at least one embodiment, V2 is an integer multiple of V1, or V1 is an integer multiple of V2.

According to at least one embodiment, the first sliding groove is a circle, a radius of the circle is equal to a distance between the center of the small tray and the center of a reaction chamber, and a distance between the center of the circle and a center of the first track is equal to the distance between the first position and the center of the small tray.

According to at least one embodiment, the first sliding groove consists of a plurality of arcs.

According to at least one embodiment, diameters of the respective arcs are set according to preset motion-passing-points, wherein the motion-passing-points are determined based on a preset relationship between the number of rotation circles of the large tray and a number of rotation circles of the small tray.

According to at least one embodiment, a side wall of the first sliding groove is smooth.

According to at least one embodiment, the sliding pin and the small tray are formed integrally.

According to at least one embodiment, the sliding protrusion and the supporting disk are formed integrally.

According to at least one embodiment, a number of the small trays is N, the large tray is provided with N tray grooves thereon, and the N tray grooves correspond to the N small trays in a one-to-one correspondence, wherein N is an integer larger than 1.

According to at least one embodiment, a number of the sliding pins is M+1, and a number of the first sliding grooves is M+1, the M+1 sliding pins correspond to the M+1 first sliding grooves in a one-to-one correspondence, or the number of the sliding pins is M, and the number of the first sliding groove is one, the M sliding pins correspond to the one first sliding groove, and wherein M is an integer larger than 1.

According to at least one embodiment, M is an integer smaller than 5.

Embodiments of the invention further provide a reaction chamber, including a chamber body, and the chamber body being provided therein with any one of above tray devices provided by various embodiments of the invention.

According to at least one embodiment, a number of the tray devices is more than one, and the tray devices are arranged layer-by-layer along an axis direction of the reaction chamber with a certain interval therebetween.

Embodiments of the invention further provide a MOCVD apparatus, including any one of above reaction chambers provided by various embodiments of the invention.

Embodiments of the invention provide non-obvious advantages over the conventional art.

According to at least one embodiment, in the tray device, through a three-layer tray mechanism consisting of a large tray, a small tray and a supporting disk, when revolving along with the large tray, the small tray spins by means of the acting force generated from a sliding mechanism provided between the small tray and the supporting disk, so that the temperature uniformity of the epitaxial growth, the concentration uniformity of the gas and the distribution uniformity of the reaction field are improved through the spinning of the small tray. Moreover, compared with a composite rotation mechanism in the conventional art that achieves the combination of revolution and spinning through a complex gas circuit structure, the composite rotation structure in the tray device, according to various embodiments of the invention, is more simple, easier to process and install, and convenient in maintenance and usage.

Similarly, as the reaction chamber and the MOCVD apparatus provided by embodiments of the invention are provided therein with the above tray device provided by various embodiments of the invention, the reaction chamber and the MOCVD apparatus also have the above beneficial effects, i.e., simple in structure, easier to process and install, and convenient in maintenance and usage.

Various objects, advantages and features of the invention will become apparent from the following description of embodiments with reference to the accompanying drawings.

BRIEF DESCRIPTION OF THE DRAWINGS

These and other features, aspects, and advantages of the invention are better understood with regard to the following Detailed Description, appended Claims, and accompanying Figures. It is to be noted, however, that the Figures illustrate only various embodiments of the invention and are therefore not to be considered limiting of the invention's scope as it may include other effective embodiments as well.

DETAILED DESCRIPTION

Figure 1:
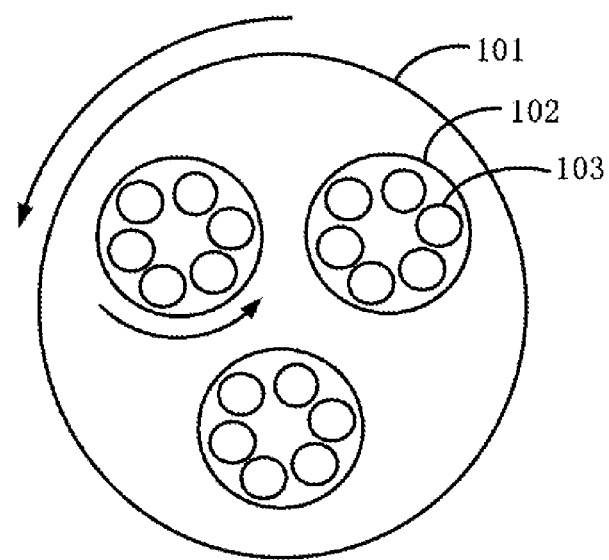
FIG. 1 is a schematic diagram of an air cushion tray planetary rotation technique according to the conventional art.

Advantages and features of the invention and methods of accomplishing the same will be apparent by referring to embodiments described below in detail in connection with the accompanying drawings. However, the invention is not limited to the embodiments disclosed below and may be implemented in various different forms. The embodiments are provided only for completing the disclosure of the invention and for fully representing the scope of the invention to those skilled in the art.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. According to at least one embodiment, the dimensions of some of the elements in the figures may be exaggerated relative to other elements to help improve understanding of embodiments of the invention. Like reference numerals refer to like elements throughout the specification.

To make those skilled in the art better understand various embodiments of the invention, a reaction chamber and a MOCVD apparatus will be described in details below in conjunction with the accompanying drawings.

Figure 2:
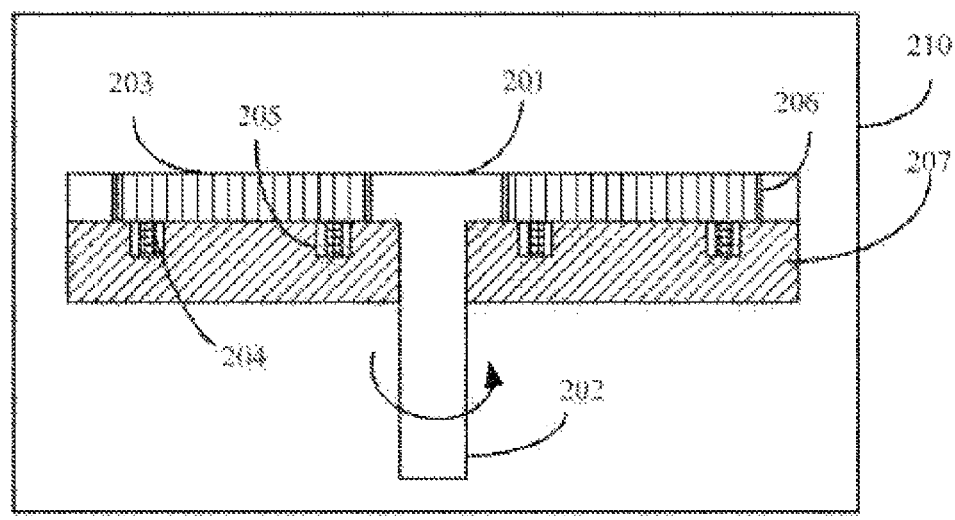
FIG. 2 is a structural schematic diagram of a reaction chamber according to an embodiment of the invention.

FIG. 2 is a structural schematic diagram of a reaction chamber according to an embodiment of the invention. As shown in FIG. 2, the reaction chamber includes a chamber body 210 and a tray device located inside the chamber body 210. The tray device includes a large tray 201, a rotating shaft 202, small trays 203, and a supporting disk 207, which is superposed under the large tray 201. Wherein the chamber body 210 is configured to be a cylindrical shape, the large tray 201 and the small tray 203 are configured to be circular trays, and the projection of the central axis of the chamber body 210 on the large tray 201 coincides with the center of the large tray 201. The rotating shaft 202 is connected with the center (i.e., the center position) of the large tray 201 and is capable of driving the large tray 201 to rotate about the rotating shaft 202 (i.e., about the central axis of the reaction chamber). Tray grooves 206 are provided on the large tray 201 for placing the small trays 203 therein, and are communicated with the supporting disk 207. Preferably, a shape (configuration) of a portion of the tray groove 206 used for accommodating the small tray 203 therein corresponds to a shape (appearance) of the small tray 203, and a sliding mechanism is provided between the support disk 207 and the small tray 203, so that the small tray 203 spins under the action of the sliding mechanism while revolving along with the large tray 201. According to at least one embodiment, the so-called revolving means that the center (i.e., the center of a circle) of the small tray 203 rotates along with the large tray 201 about the center of the large tray 201, and the so-called spin means that the small tray 203 rotates about its own center.

According to at least one embodiment, the rotating shaft 202 passes through the center of the supporting disk 207, but not connected thereto, and therefore the supporting disk 207 is fixed and unmovable. The tray groove 206 and the supporting disk 207 are communicated fully or partly. In a case where the tray groove 206 and the supporting disk 207 are communicated fully, the tray groove 206 has no bottom, but presents in a form of through hole that penetrates through the large tray 201 completely in the thickness direction of the large tray 201, and thus the large tray 201 cannot support the small tray 203 in a vertical direction, and the small tray 203 is supported by the supporting disk 207 by means of the sliding mechanism. In a case where the tray groove 206 and the supporting disk 207 are communicated partly, the tray groove 206 has a bottom, on which a hole communicated with the supporting disk 207 exists, thus the connection of the small tray 203 and the sliding mechanism are achieved by means of the above "hole", and the small tray 203 are supported by the bottom of the tray groove 206 and/or by the supporting disk 207 by means of the sliding mechanism. In a case where the small tray 203 is supported only by the bottom of the tray groove 206, the frictional force between the sliding mechanism and the small tray 203 is relatively small, and the sliding action is provided more effectively to drive the small tray 203 to spin.

According to at least one embodiment, the sliding mechanism includes a sliding pin 204 and a first sliding groove 205. The first sliding groove 205 is formed at the upper surface of the supporting disk 207, and the upper end of the sliding pin 204 is fixedly connected to a first position other than the center position on the small tray 203. The lower end of the sliding pin 204 is slidably connected to the first sliding groove 205 and is configured to move along the first sliding groove 205. To ensure a continuous rotation of the small tray 203, the starting point and the ending point of the first sliding groove 205 coincide, so that the first sliding groove 205 presents a closed form. Moreover, the distance between any point on the first sliding groove 205 and a first track 31 is smaller than or equal to the distance between the first position and the center of the small tray 203, and at least one point, distance of which from the first track 31 is smaller than the distance between the first position and the center of the small tray 203, exists on the first sliding groove 205. According to at least one embodiment, the first track 31 is a movement track formed by the center point of the small tray 203 when the small tray 203 revolves, and this movement track is a circle having the center of the reaction chamber as its center. According to at least one embodiment, the distance between any point on the first sliding groove 205 and the first track 31 refers to the minimum distance between the point and the first track 31. As the distance between the first position on the small tray 203 and the center of the small tray 203 is fixed, the first sliding groove 205 is thus required to be configured that the distance between any point thereon and the first track 31 is not allowed to be larger than the distance between the first position and the center of the small tray 203, otherwise the movement of the small tray 203 will be blocked or stopped.

Figure 3A:
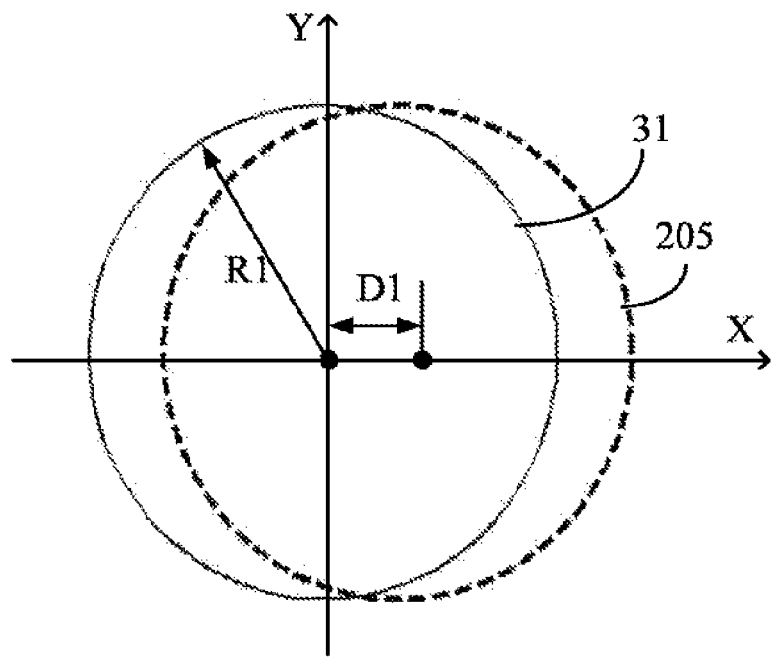
FIG. 3A is a schematic diagram of a first configuration of a first sliding groove in a tray device according to an embodiment of the invention.

In the above described configurations, according to at least one embodiment, since that the small tray 203 is limited within the tray groove 206 of the large tray 201, as the large tray 201 rotates, the center of the small tray 203 is always in a circular motion about the center of the reaction chamber, for example, a movement along a track 31 shown in FIG. 3A, i.e., the rotation of the large tray 201 drives the small tray 203 to revolve. According to another embodiment, in a case where the shape (profile) of the first sliding groove 205 is configured to a shape (profile) other than a circle taking the center of the reaction chamber as its center, when the sliding pin 204 moves along the first sliding groove 205, the small tray 203 above the sliding pin 204 is driven to move, and the first position thereon is not in a circular motion about the center of the reaction chamber when the small tray 203 revolves along with the large tray 201, i.e., the small tray 203 spins under a driving force of the sliding pin 204 while revolving. The spinning of the small tray 203 is controlled by configuring the shape (profile) of the first sliding groove 205. The shape (profile) of the first sliding groove 205 herein may refer to a track profile along which the sliding pin 204 is configured to move and drive the small tray 203 to spin when the large tray 201 rotates about the rotating shaft 202. Examples of the shape (profile) of the first sliding groove 205 are illustrated by the broken lines in FIGS. 3A-3E.

According to at least one embodiment, the shape (profile) of the first sliding groove 205, as illustrated as examples in FIGS. 3A-3E, is configured by various ways. For example, a first way includes pre-setting a rotation speed of V1 of the large tray 201 about its center (i.e., how many circles the large tray 201 rotates about its center in a unit time, and is also simply referred to as a rotation rate n1), pre-setting a rotation speed of V2 of the small tray 203 about its center (i.e., how many circles the small tray 203 rotates about its center in a unit time, and is also simply referred to as a rotation rate n2), and determining the shape (profile) of the first sliding groove 205 based on the preset V1 and V2. Specifically, the shape (profile) of the first sliding groove 205 can be determined based on V1, V2, the distance between the center of the large tray 201 and the center of the small tray 203, and the distance D1 between the first position and the center of the small tray 203. Preferably, V2 is set to be an integer multiple of V1, and in this case, when the center of the small tray 203 returns to its original position after rotating one circle along with the large tray 201, the sliding pin 204 provided to the small tray 203 also returns to the original position so as to continue moving along the first sliding groove 205. Alternatively, V1 is also set to be an integer multiple of V2, e.g., V1 is set to be 3 times of V2. In this case, the sliding pin 204 provided to the small tray 203 will return to its original position after the large tray 201 rotates three circles.

In the above configuration, in a case where a plane coordinate system with the center of the large tray 201 as an origin is set up, and the small tray 203 is set to revolve at a speed of V1, the initial position of the center of the small tray 203 is (R1, 0), where R1 is the distance between the center of the small tray 203 and the center of the large tray 201, the expressions of the coordinates (X0, Y0) of the center of the small tray 203 with respect to time t are: X0=R1×cos(2×pi×V1×t); Y0=R1×sin(2×pi×V1×t), where pi is ratio of the circumference of a circle to its diameter. In a case where the small tray 203 spins at a speed of V2, based on the center position of the small tray 203, the expressions of the coordinates (X1, Y1) of the first position thereon with respect to time t can be obtained as:

$$X1 = X0 + D1 \times \cos(2 \times pi \times V2 \times t) \qquad \text{Equation 1}$$

$$Y1 = Y0 + D1 \times \sin(2 \times pi \times V2 \times t) \qquad \text{Equation 2}$$

According to at least one embodiment, the track of the first position is determined based on the above equations, i.e., the shape (profile) of the first sliding groove 205 is determined.

Configuring the shape (profile) of the first sliding groove 205 will be explained in conjunction with the following specific examples.

According to at least one embodiment, FIG. 3A is a schematic diagram of a first configuration of a first sliding groove in a tray device according to an embodiment of the invention. In this example, V2=0 is set, i.e., the small tray 203 will not spin, and in this case, although the small tray 203 revolves along with the large tray 201, the orientation of the sliding pin 204 provided to the small tray 203 is unchanged at all times with respect to the center of the small tray 203. Thus, the above equation 1 and 2 can be simplified as:

$$X1 = X0 + D1; \qquad \text{Equation 3}$$

$$Y1 = Y0; \qquad \text{Equation 4}$$

From the above equations 3 and 4, it can be seen that, as the track (i.e., the first track 31) of the center (X0, Y0) of the small tray 203 is a circle, the track of the first position (X1, Y1) on the small tray 203 (i.e., the first sliding groove 205) is also a circle, and the distance between the center of the first sliding groove 205 and the center of the first track 31 is D1. For example, the shape (profile) of the first sliding groove 205 may be represented as: $(x-D1)^2+y^2=R1^2$. In this embodiment, description will be made by taking the center of the first sliding groove 205 being located at coordinates (D1, 0) as an example, and however, the center of the first sliding groove 205 is also any point at a distance D1 from the center of the first track 31.

According to at least one embodiment, the shape (profile) of the first sliding groove 205 is configured, so that when the large tray 201 rotates at a rotation speed of V1, the small tray 203 revolves along with the large tray 201 at the speed of V1, while the sliding pin 204 connected with the small tray 203 moves as the movement of the small tray 203. In this case, the sliding pin 204 moves along the first sliding groove 205 due to the acting force from the side wall of the first sliding groove 205. As distances from respective points on the first sliding groove 205 to the center of the reaction chamber are different, the distance between the moving sliding pin 204 within the first sliding groove 205 and the center of the reaction chamber is varied, therefore, the movement of the sliding pin 204 within the first sliding groove 205 will drive the small tray 203 to spin at a preset speed or not to spin.

In a case where patterns are unable to be obtained from the above equations, a simulation tool, such as Matlab, may be used to set a step length of t, to obtain a curve of (X1, Y1) with respect to t.

According to at least one embodiment, the second way includes configuring the shape (profile) of the first sliding groove 205 according to a pre-set relationship between a number of rotations of the large tray 201 and a number of rotations of the small tray 203. For example, the number of rotations of the small tray 203 corresponding to one rotation cycle of the large tray 201 may be pre-set, and then a plurality of motion-passing-points of the small tray 203 (for example, points P1-P8 as shown in FIG. 3B) are set according to the number of rotations of the small tray 203 corresponding to one rotation cycle of the large tray 201, and these motion-passing-points (for example, P1-P8 in FIG. 3B) are connected by curves such as arcs, and a closed shape (profile) of the first sliding groove 205 may be determined.

According to at least one embodiment, the configuration of the first sliding groove 205 will be explained through the following specific examples.

Figure 3B:
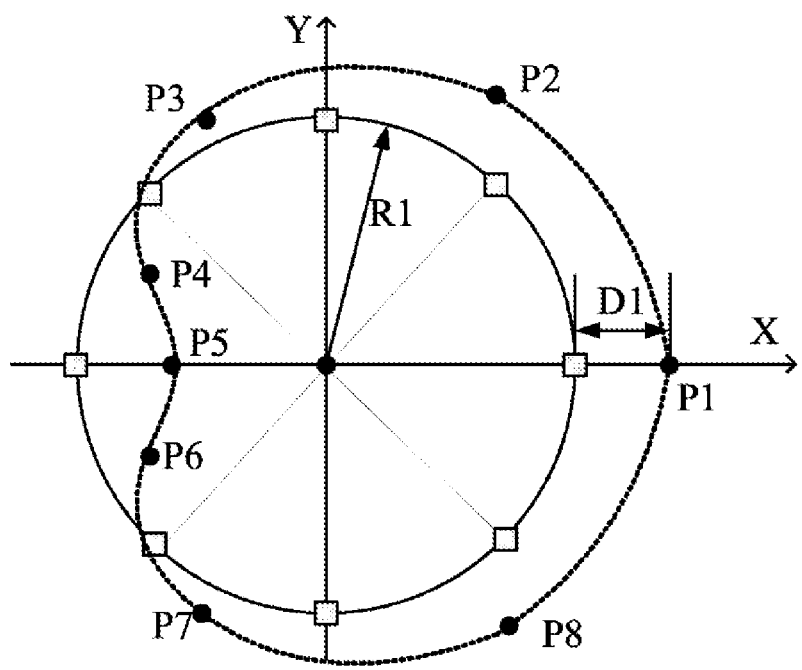
FIG. 3B is a schematic diagram of a second configuration of the first sliding groove in the tray device according to an embodiment of the invention.

According to at least one embodiment, FIG. 3B is a schematic diagram of a second configuration of the first sliding groove in the tray device according to an embodiment of the invention. In this example, a number of rotations of the small tray 203 corresponding to one rotation cycle of the large tray 201 is set to be 2, and an initial position of the center of the small tray 203 is (R1, 0). When the small tray 203 has revolved integral times of pi/4, the center of the small tray 203 passed through positions represented by hollow boxes as shown in FIG. 3B, coordinates of which are (R1, 0), $$\left(\frac{\sqrt{2}}{2}R1, \frac{\sqrt{2}}{2}R1\right),$$

(0, R1), $$\left(-\frac{\sqrt{2}}{2}R1, \frac{\sqrt{2}}{2}R1\right),$$

(−R1, 0), $$\left(-\frac{\sqrt{2}}{2}R1, \frac{\sqrt{2}}{2}R1\right),$$

(0, −R1) and $$\left(\frac{\sqrt{2}}{2}R1, -\frac{\sqrt{2}}{2}R1\right),$$

respectively.

Corresponding to the positions represented by the respective hollow boxes, the first position on the small tray 203 moves and passes through positions represented by 8 points P1-P8 in FIG. 3B, respectively, and the coordinates of these 8 points P1-P8 are (R1+D1, 0), $$\left(\frac{\sqrt{2}}{2}R1, \frac{\sqrt{2}}{2}R1+D1\right),$$

(−D1, R1), $$\left(-\frac{\sqrt{2}}{2}R1, \frac{\sqrt{2}}{2}R1-D1\right),$$

(−R1+D1, 0), $$\left(-\frac{\sqrt{2}}{2}R1, -\frac{\sqrt{2}}{2}R1+D1\right),$$

(−D1, −R1) and $$\left(\frac{\sqrt{2}}{2}R1, -\frac{\sqrt{2}}{2}R1-D1\right),$$

respectively. In this case, taking P2 as an example, when the small tray 203 revolves to the position of pi/4, the first position on the small tray 203 is located right above the center of the small tray 203, as shown in FIG. 3B. Thus, the position of P1 can be obtained based on the position of the center of the small tray 203. Then, 8 points P1-P8 are set as the motion-passing-points, and these motion-passing-points are connected by curves such as arcs. The final obtained closed curve may be determined as the shape (profile) of the first sliding groove 205. The curve passing through the motion-passing-points (for example, P1-P8) may be obtained by using drawing tools, such as Visio and CAD, or may be obtained by means of curve fitting using simulation tools, such as Matlab. A result by means of curve fitting will be given below, with reference to the following expressions and the curve represent by dotted line in FIG. 3B, wherein the first sliding groove 205 consists of, for example, three arcs, expressions of which are:

$(x-a)^2+y^2=S1^2$, if $(x,y)$ is within $[-\pi/3,\pi/3]$;

$(x+b1)^2+(y+b2)^2=S2^2$, if $(x,y)$ is within $[\pi/3,\pi]$; and $(x+b1)^2+(y-b2)^2=S2^2$, if $(x,y)$ is within $[\pi,5\pi/3]$, respectively, where a, b1, b2, S1 and S2 are parameters obtained by fitting and will not be described herein.

It should be noted that, in practical applications, when the shape (profile) of the first sliding groove 205 is set according to the relationship between the number of rotations of the large tray 201 and the number of rotations of the small tray 203, the number of the motion-passing-points of the first position (for example, P1-P8) on the small tray 203 is not limited to 8 as above, and other numbers are possible. Further, according to at least one embodiment, the shape (profile) of the first sliding groove 205 is also set according to motion-passing-points of another position, other than P1-P8 as shown in FIG. 3B, on the small tray 203. In addition, in practical applications, based on the above set 8 motion-passing-points, it is not limited to obtain the first sliding groove 205 consisting of the three arcs. Moreover, in a case where the closed curve for the first sliding groove 205 is determined by fitting the motion-passing-points, after fitting and correcting for the curve, the closed curve obtained finally may only pass through a part of the motion-passing-points, i.e., the actually obtained closed curve is not coincided with part of the motion-passing-points. In addition, an arc is also determined by adjacent motion-passing-points, and the shape (profile) of the first sliding groove 205 is formed by connecting a plurality of the arcs.

Figure 3C:
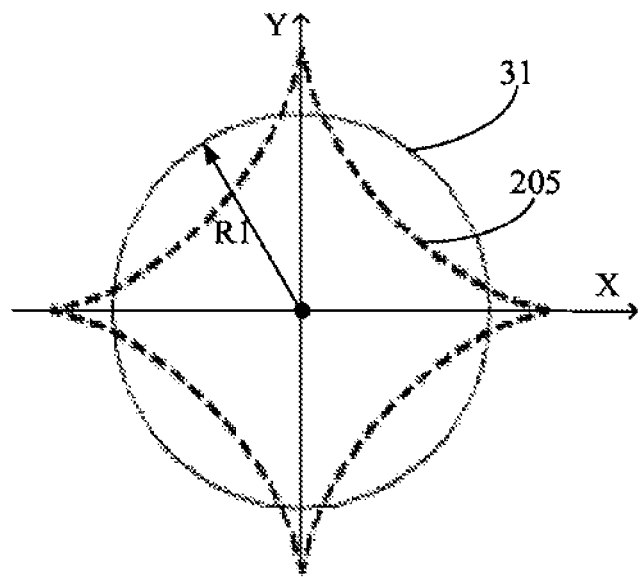
FIG. 3C is a schematic diagram of a third configuration of the first sliding groove in the tray device according to an embodiment of the invention.

According to at least one embodiment, FIG. 3C is a third configuration of the first sliding groove in the tray device according to an embodiment of the invention. In this embodiment, it is set that, when the large tray 201 rotates 1 circle, the small tray 203 reversely spins 3 circles, and the shape (profile) of the first sliding groove 205 as shown in FIG. 3C is obtained based on the same or similar principles and configuring methods as the examples in FIG. 3A or FIG. 3B.

Figure 3D:
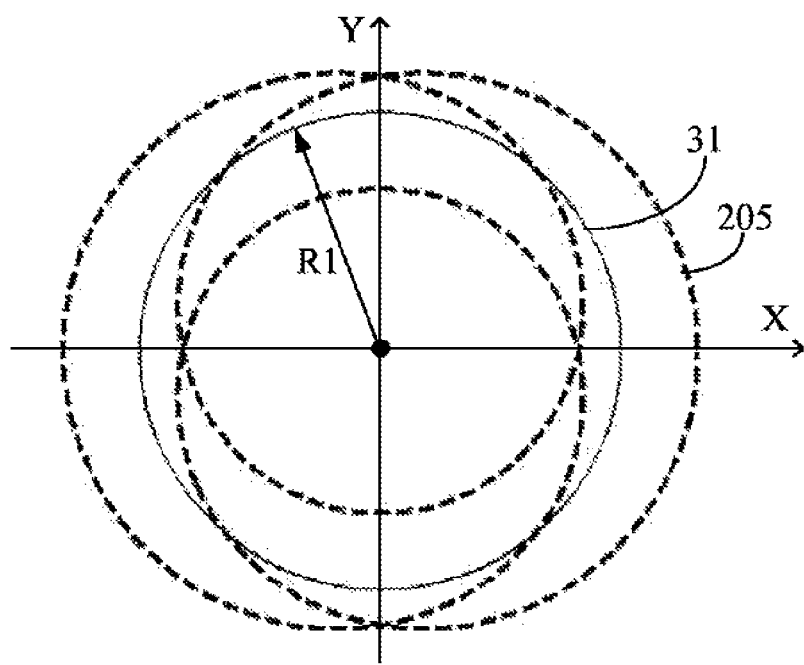
FIG. 3D is a schematic diagram of a fourth configuration of the first sliding groove in the tray device according to an embodiment of the invention.

According to at least one embodiment, FIG. 3D is a fourth configuration of the first sliding groove in the tray device according to an embodiment of the invention. In this embodiment, it is set that $V2=\frac{1}{3}\times V1$, i.e., when the large tray 201 rotates 3 circles, the small tray 201 spins 1 circle in the same direction. Also, the shape (profile) of the first sliding groove 205 as shown in FIG. 3D is obtained based on the same or similar principles and configuring methods as the examples in FIG. 3A or FIG. 3B.

In the examples illustrated in FIGS. 3A to 3D, the spinning speed of the small tray 203 may be constant, or may not be constant. For example, in a case where the shape (profile) of the first sliding groove 205 adopts the shape (profile) as determined in the example in FIG. 3A, the spinning speed of the small tray 203 is a constant. In other words, in a case where the shape (profile) of the first sliding groove 205 is determined by using the motion-passing-points (for example, P1-P8 as shown in FIG. 3B), the spinning speed of the small tray 203 is unnecessary to be constant, however, the relationship between the number of circles of movement of the large tray 201 and the number of circles of movement of the small tray 203 is fixed.

Figure 3E:
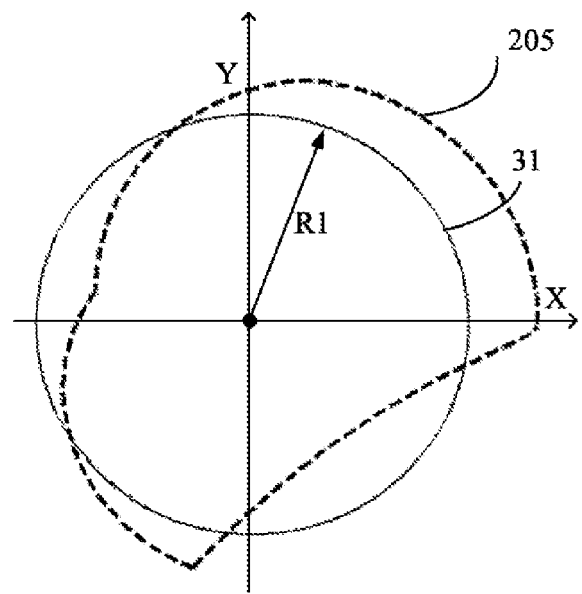
FIG. 3E is a schematic diagram of a fifth configuration of the first sliding groove in the tray device according to an embodiment of the invention.

It should be noted that although the relationship between the speed of movement of the small tray 203 and the speed of movement of the large tray 201 is fixed (or the relationship between the number of circles of movement of the large tray 201 and the number of circles of movement of the small tray 203 is fixed) in the foregoing examples, the relationship between speeds or the said relationship between the numbers of circles of movements may also not be fixed. For example, referring to FIG. 3E is a fifth configuration of the first sliding groove in the tray device according to an embodiment of the invention. In this embodiment, the spinning speed of V2 is set to be variable, wherein when the first position is within 4 different intervals, V2 is valued as below:

if the first position is within $[0,\pi/2]$, $V2=\frac{1}{3}\times V1$;

if the first position is within $[\pi/2,\pi]$, $V2=0$;

if the first position is within $[\pi,3\pi/2]$, $V2=2\times V1$; and if the first position is within $[3\pi/2,2\pi]$, $V2=-7/3\times V1$.

According to the relationships between V1 and V2, a corresponding shape (profile) of the first sliding groove 205, according to at least one embodiment, can be set, and the specific configuring procedure is similar to those in the above embodiments and will not be repeated herein.

It should be further noted that, in the various embodiments of the invention, the number of the small trays 203 is N, and N tray grooves 206 are correspondingly provided on the large tray 201, and the N tray grooves 206 correspond to the N small trays 203 in a one-to-one correspondence, where N is an integer larger than 1. Further, the number of the sliding pins 204 provided to the small tray 203 may be M+1, the number of the first sliding grooves 205 is M+1, and the M+1 first sliding grooves 205 correspond to the M+1 sliding pins 204 in a one to one correspondence. Alternatively, in a case where the number of the sliding pins 204 provided to the small tray 203 is M, the positions of the M sliding pins 204 may be set, so that the M sliding pins 204 commonly correspond to one first sliding groove 205, wherein M is an integer larger than 1. Preferably, the number of the sliding pins provided to each small tray 203 may be set to be 2 to 4, and in this case, the rotation of the small tray 203 will be more stable, and the structures of the first sliding grooves 205, for example, will not be complex. More preferably, the small tray 203 and the sliding pins 204 are formed integrally.

Figure 4:
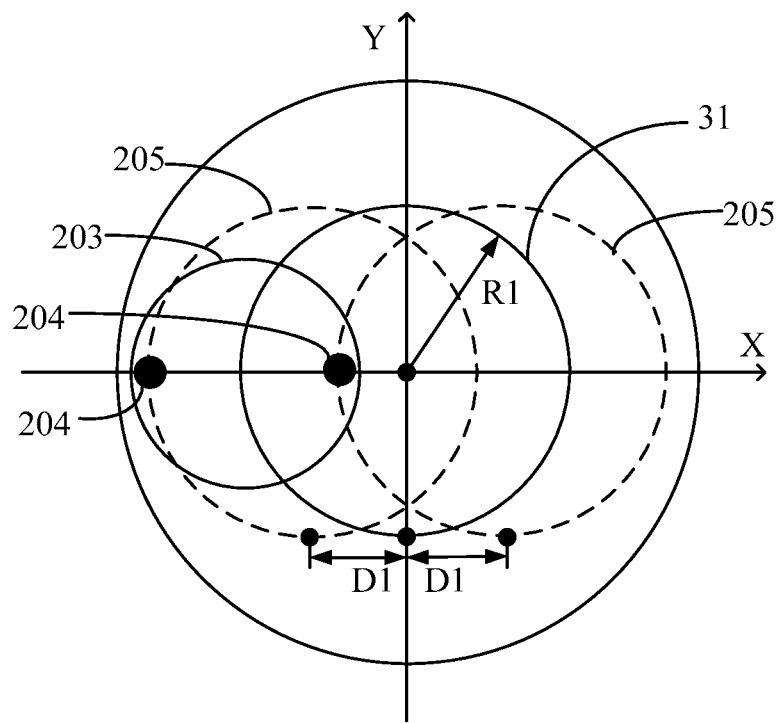
FIG. 4 is a schematic diagram of a configuration of another first sliding groove in the tray device according to an embodiment of the invention.

A specific example where the number of the sliding pins 204 provided to one small tray 203 is 2 is given below. FIG. 4 is a schematic diagram of a configuration of another first sliding groove in a tray device according to an embodiment of the invention. In this embodiment, two sliding pins 204 are correspondingly fixedly connected to a first position and a second position on the small tray 203, respectively, the first position and the second position are symmetrical with respect to the center of the small tray 203, and the distance between each of the positions and the center of the small tray 203 is D1. Two first sliding grooves 205 are provided correspondingly to the above two sliding pins 204, respectively. In a case where the rotation speed of the large tray 201 is set to be V1, the spinning speed of the small tray 203 is set to be $V2=-V1$. In a case where a plane coordinate system with the center of the first track 31 as an origin is set up, the first track 31 is expressed by the following expression: $x^2+y^2=R1^2$, where R1 is the distance between the center of the small tray 203 and the center of the reaction chamber, so that the expressions for the two first sliding grooves 205 are $(x-D1)^2+y^2=R1^2$ and $(x+D1)^2+y^2=R1^2$, respectively.

By means of the first sliding grooves 205 configured in above manner, when the large tray 201 rotates at the rotation speed of V1, the small tray 203 revolves along with the large tray 201 at the speed of V1 due to the acting force from the sliding mechanism, while spinning at the speed of V2.

According to at least one embodiment, the side wall of the first sliding groove 205 is preferably to be smooth, i.e., the wall surface inside the first sliding groove 205 is smooth without sudden points, so that the acting force on the sliding pin 204 from the sliding groove 205 is relatively stable, which will not block the movement of the small tray 203 along the first sliding groove 205, so that the movement of the small tray 203 will be more smooth and stable.

Figure 5:
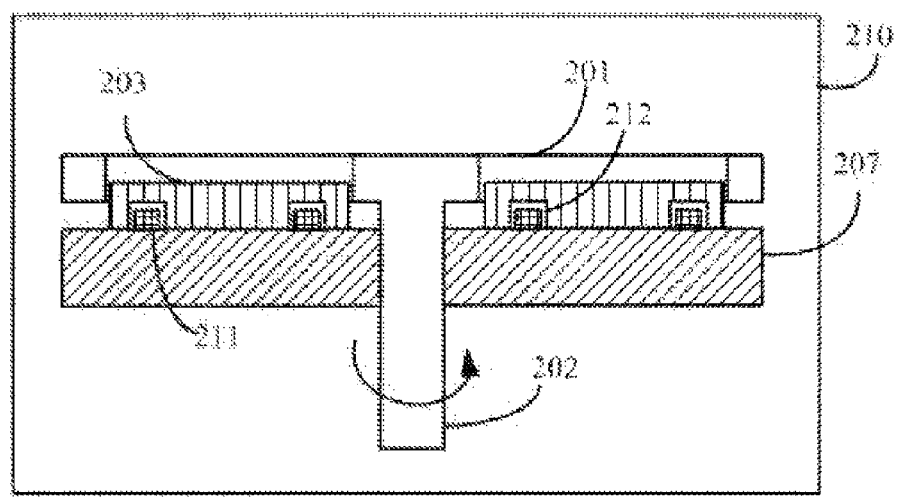
FIG. 5 is a structural schematic diagram of another sliding mechanism in a tray device according to an embodiment of the invention.

FIG. 5 is a structural schematic diagram of another sliding mechanism in the tray device according to an embodiment of the invention. This sliding mechanism includes a sliding protrusion 211 and a second sliding groove 212. The second sliding groove 212 is formed on the lower surface of the small tray 203, the sliding protrusion 211 is provided on the upper surface of a supporting disk 207, and is fitted in the second sliding groove 212. When the small tray 203 is moving with the movement of the large tray 201, the second sliding groove 212 is capable of moving along the sliding protrusion 211. By designing a shape (appearance) of the sliding protrusion 211, the small tray 203 spins by the acting force between the second sliding groove 212 and the sliding protrusion 211, which are fitted each other, while the small tray 203 revolves due to driving of the large tray 201. Based on the same or similar principles and methods as above examples, the shapes of the sliding protrusion 211 and the second sliding groove 212 are determined. For example, the second sliding groove 212 is configured as an arc intersecting with the edge of the small tray 203, the sliding protrusion 211 is configured as a plurality of cylindrical protrusions distributed on the supporting disk 207, and slides through the second sliding groove 212, so that the small tray 203 is caused to spin by the interaction force between the sliding protrusion 211 and the second sliding groove 212. The second sliding groove 212 is also configured to be other shapes, and the distributed positions of the sliding protrusion 211 is also set based on the shape (profile) of the second sliding groove 212. In addition, the lower surface of the large tray 201 should be higher than the height of the sliding protrusion 211 to ensure that the sliding protrusion 211 will not impact on the rotation of the large tray 201. The sliding protrusion 211 and the supporting disk 207 are formed integrally.

Figure 6:
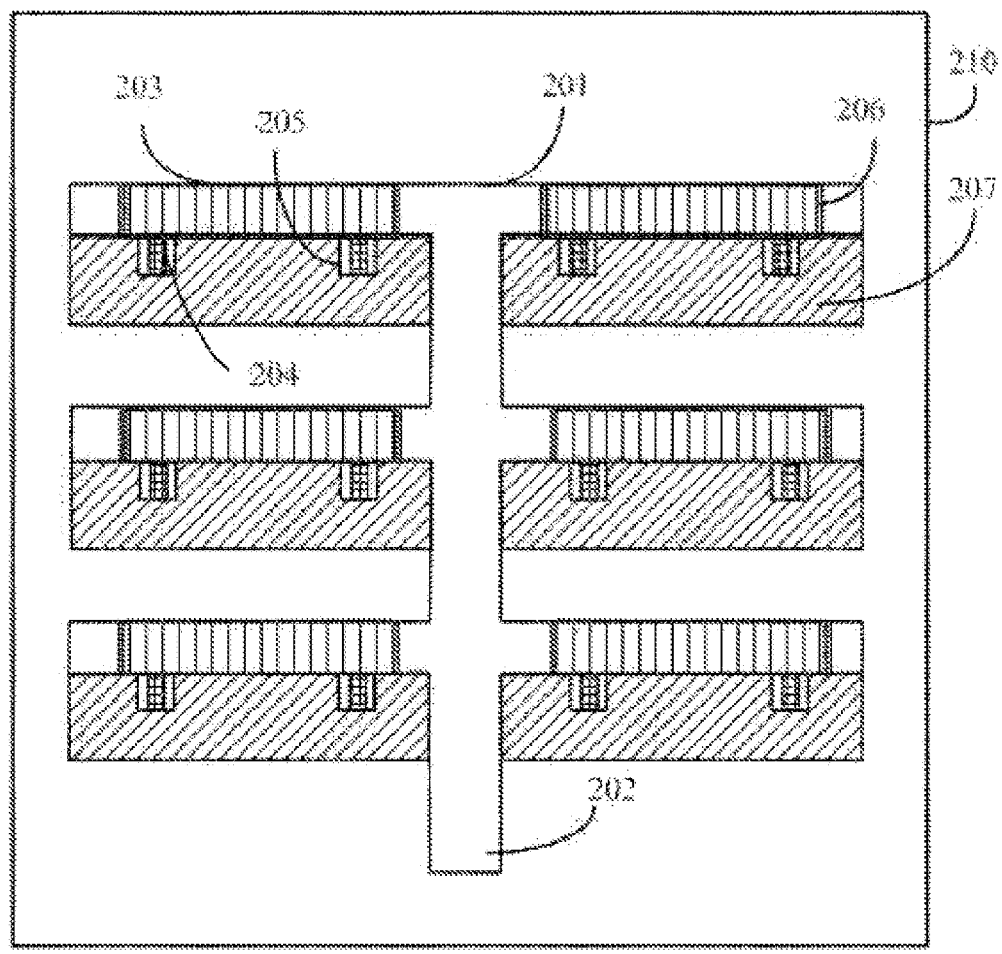
FIG. 6 is a structural schematic diagram of another reaction chamber according to an embodiment of the invention.

FIG. 6 is a structural schematic diagram of another reaction chamber according to an embodiment of the invention. This reaction chamber includes a chamber body 210 and a multilayer tray device located within the chamber body 210 and arranged layer-by-layer in a vertical direction. In this case, one layer or all layers of the multilayer tray device adopt any of the tray devices provided by the foregoing embodiments of the invention. When all of the tray devices of the multilayer tray device adopt the tray devices provided by the foregoing embodiments of the invention, the center of the large tray 201 is superposed with the center of the supporting disk 207 in the multiple tray devices, and the multiple tray devices share one rotating shaft 202. The rotating shaft 202 penetrates through the center of each large tray 201 and the center of each supporting disk 207 in an axis direction of the reaction chamber, and is fixedly connected with each large tray 201 to drive the large trays 201 in the respective layers of tray devices to revolve under the actuation of the rotating shaft 202. Further, the respective layers of tray devices are also connected to the same central gas intake pipe (not shown in Figure), and this central gas intake pipe is used for introducing gas for elements to be processed on the respective layers of tray devices.

In embodiments of the present invention, the number of the small trays 203 placed on the large tray 201 are one or more than one.

The reaction chambers according to various embodiments of the invention adopt various heating methods. When adopting an induction heating method, the spinning of the small tray 203 allows the elements to be processed on the small tray 203 to alternatively pass through a region with sparse magnetic force lines and a region with intensive magnetic force lines in a magnetic field, so that the temperature uniformity for the elements is improved. Further, it is also possible to adopt the thermal transmission method and the multi-region temperature control and uniform heating technique, and the thermal radiation source is placed under the supporting disk 207.

The reaction chambers according to various embodiments of the invention adopt various gas intake systems to introduce gas. For example, it is possible to adopt a central gas intake system or a spray header gas intake system, as non-limiting examples. In processing, the concentration of the gas inside the reaction chamber is typically gradually decreased in the radial direction of the chamber, however, in a case where the reaction chambers according to various embodiments of the invention are adopted, positions of the elements carried by the small tray 203 in the reaction chamber are not fixed in the radical direction of the reaction chamber by means of the revolution and spinning of the small tray 203, so that the reaction products are substantially the same due to that the concentrations of the gas are substantially the same for different positions on the elements, thereby improving the uniformity of the epitaxial thin film on the element.

Embodiments of the invention also provide a MOCVD apparatus, which includes any of the reaction chambers according to the embodiments of the invention.

In the tray device according to embodiments of the invention, through a three-layer tray mechanism consisting of a large tray 201, a small tray 203 and a supporting disk 207, when revolving along with the large tray 201, the small tray 203 spins by means of the acting force generated from a sliding mechanism provided between the small tray 203 and the supporting disk 207, so that the temperature uniformity of the epitaxial growth, the concentration uniformity of the gas and the distribution uniformity of the reaction field are improved through the spinning of the small tray 203. Moreover, compared with a composite rotation mechanism in the conventional art that achieves the combination of revolution and spinning through a complex gas circuit structure, the composite rotation structure in the tray device according to various embodiments of the invention is more simple, easy to process and install, and convenient in maintenance and usage.

Similarly, as the reaction chamber and the MOCVD apparatus according to embodiments of the invention are provided therein with the above tray device according to various embodiments of the invention, the reaction chamber and the MOCVD apparatus also have the above beneficial effects, i.e., simple in structures, easier to process and install, and convenient in maintenance and usage.

Terms used herein are provided to explain embodiments, not limiting the invention. Throughout this specification, the singular form includes the plural form unless the context clearly indicates otherwise. When terms "comprise" and/or "comprising" used herein do not preclude existence and addition of another component, step, operation and/or device, in addition to the above-mentioned component, step, operation and/or device.

Embodiments of the invention may suitably comprise, consist or consist essentially of the elements disclosed and may be practiced in the absence of an element not disclosed. According to at least one embodiment, it can be recognized by those skilled in the art that certain steps can be combined into a single step.

The terms and words used in the specification and claims should not be interpreted as being limited to typical meanings or dictionary definitions, but should be interpreted as having meanings and concepts relevant to the technical scope of the invention based on the rule according to which an inventor can appropriately define the concept of the term to describe the best method he or she knows for carrying out the invention.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The singular forms "a," "an," and "the" include plural referents, unless the context clearly dictates otherwise.

As used herein and in the appended claims, the words "comprise," "has," and "include" and all grammatical variations thereof are each intended to have an open, non-limiting meaning that does not exclude additional elements or steps.

As used herein, it will be understood that unless a term such as 'directly' is not used in a connection, coupling, or disposition relationship between one component and another component, one component may be 'directly connected to', 'directly coupled to' or 'directly disposed to' another element or be connected to, coupled to, or disposed to another element, having the other element intervening therebetween.

As used herein, the terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "according to an embodiment" herein do not necessarily all refer to the same embodiment.

Although the invention has been described in detail, it should be understood that various changes, substitutions, and alterations can be made hereupon without departing from the principle and scope of the invention. Accordingly, the scope of the invention should be determined by the following claims and their appropriate legal equivalents.

What is claimed is:

1. A tray device, comprising:
a large tray; a rotating shaft; a small tray; and a supporting disk,
wherein
the rotating shaft is connected with a center of the large tray and is configured to drive the large tray to rotate about the rotating shaft,
a tray groove configured to place the small tray therein is provided on the large tray, and
the supporting disk is located under the large tray, a sliding mechanism is provided between the supporting disk and the small tray, and, when the small tray revolves along with the large tray, the small tray is driven to spin in response to a sliding operation of the sliding mechanism, and the small tray is supported by the supporting disk by means of the sliding mechanism,
the sliding mechanism comprises a first sliding groove and a sliding pin, the first sliding groove being formed at an upper surface of the supporting disk, the first sliding groove being a closed track, an upper end of the sliding pin being fixedly connected to a first position other than a center of the small tray, a lower end of the sliding pin contacting the first sliding groove, and the sliding pin being configured to move along the first sliding groove, and when the large tray rotates about the rotating shaft, the first sliding groove on the supporting disk being fixed.

2. The tray device according to claim 1, wherein
a distance between any point on the first sliding groove and one point on a first track is smaller than or equal to a distance between the first position and the center of the small tray, the first track being determined by a movement track of the center point of the small tray when the small tray revolves, and
at least one point exists on the first sliding groove, a distance between the at least one point and one point on the first track being smaller than the distance between the first position and the center of the small tray.

3. The tray device according to claim 2, wherein a shape of the first sliding groove is determined by a movement track of the first position, and expressions of coordinates (X1, Y1) of the first position with respect to time t are:

$$X1 = R1 \times \cos(2 \times pi \times V1 \times t) + D1 \cos(2 \times pi \times V2 \times t); \text{ and}$$

$$Y1 = R1 \times \sin(2 \times pi \times V1 \times t) + D1 \sin(2 \times pi \times V2 \times t);$$

wherein: the center of the large tray is set as an origin of the coordinates, R1 is a distance between the center of the small tray and the center of the large tray, D1 is the distance between the first position and the center of the small tray, V1 is a rotation speed of the large tray, V2 is a spinning speed of the small tray; and a relationship between V1 and V2 is determined by: V2 being an integer multiple of V1 or V1 being an integer multiple of V2.

4. The tray device according to claim 2, wherein a shape of the first sliding groove is a circle, a radius of the circle is equal to a distance between the center of the small tray and a center of a reaction chamber, and a distance between a center of the circle and a center of the first track is equal to the distance between the first position and the center of the small tray.

5. The tray device according to claim 2, wherein a shape of the first sliding groove consists of a plurality of arcs.

6. The tray device according to claim 5, wherein diameters of the respective arcs are set according to preset motion-passing-points, wherein the motion-passing-points are determined based on a preset relationship between a number of rotations of the large tray and a number of rotations of the small tray.

7. The tray device according to claim 5, wherein a side wall of the first sliding groove includes a surface without sudden points.

8. The tray device according to claim 2, wherein the sliding pin and the small tray are formed integrally.

9. The tray device according to claim 1, wherein a number of the small trays is N, the large tray is provided with N tray grooves thereon, and the N tray grooves correspond to the N small trays in a one-to-one correspondence, wherein N is an integer greater than 1.

10. The tray device according to claim 2, wherein a number of the sliding pins is M+1, and a number of the first sliding grooves is M+1, the M+1 sliding pins correspond to the M+1 first sliding grooves in a one-to-one correspondence; or the number of the sliding pins is M, and the number of the first sliding grooves is one, the M sliding pins correspond to the one first sliding groove; and wherein M is an integer greater than 1.

11. The tray device according to claim 10, wherein M is an integer less than 5.

12. A reaction chamber, comprising a chamber body, wherein the chamber body is provided therein with the tray device according to claim 1.

13. The reaction chamber according to claim 12, wherein a number of the tray devices is more than one, the tray devices being arranged layer-by-layer along an axis direction of the reaction chamber with a certain interval therebetween.

14. The reaction chamber according to claim 13, wherein the center of the large tray is superposed with a center of the supporting disk in the tray devices, and the tray devices share one rotating shaft, the rotating shaft configured to penetrate through the center of each large tray and the center of each supporting disk along the axis direction of the reaction chamber, and being fixedly connected with each large tray.

15. A MOCVD apparatus, wherein the MOCVD apparatus comprises the reaction chamber according to claim 12.

16. A tray device, comprising:

a large tray; a rotating shaft; a small tray; and a supporting disk, wherein;

the rotating shaft is connected with a center of the large tray and is configured to drive the large tray to rotate about the rotating shaft, a tray groove configured to place the small tray therein is provided on the large tray, the tray groove being communicated with the supporting disk, the supporting disk is located under the large tray, the supporting disk is fixed and unmovable, and a sliding mechanism is provided between the supporting disk and the small tray, and, when the small tray revolves along with the large tray, the small tray is driven to spin in response to a sliding operation of the sliding mechanism, and the small tray is supported by the supporting disk by means of the sliding mechanism, the sliding mechanism comprises a second sliding groove and a sliding protrusion, the sliding protrusion being formed at an upper surface of the supporting disk, the second sliding groove being formed at a bottom surface of the small tray, the second sliding groove being a closed track and formed at a first position other than a center of the small tray, an upper end of the sliding protrusion being slidably contacting the second sliding groove, and, when the small tray moves along with the large tray, the sliding protrusion being configured to move along the second sliding groove to drive the small tray to spin, and when the large tray rotates about the rotating shaft, the sliding protrusion on the support disk being fixed.

17. The tray device according to claim 16, wherein a number of the small trays is N, the large tray is provided with N tray grooves thereon, and the N tray grooves correspond to the N small trays in a one-to-one correspondence, wherein N is an integer greater than 1.

18. The tray device according to claim 16, wherein the sliding protrusion and the supporting disk are formed integrally.

19. A reaction chamber, comprising a chamber body, wherein the chamber body is provided therein with the tray device according to claim 16.

20. A MOCVD apparatus, wherein the MOCVD apparatus comprises the reaction chamber according to claim 19.

* * * * *